(12) United States Patent
Nolan et al.

(10) Patent No.: US 6,356,161 B1
(45) Date of Patent: Mar. 12, 2002

(54) CALIBRATION TECHNIQUES FOR A PRECISION RELAXATION OSCILLATOR INTEGRATED CIRCUIT WITH TEMPERATURE COMPENSATION

(75) Inventors: James B. Nolan, Chandler; Ryan Scott Ellison, Mesa, both of AZ (US)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 09/299,338

(22) Filed: Apr. 26, 1999

Related U.S. Application Data (63) Continuation-in-part of application No. 09/044,361, filed on Mar. 19, 1998, now Pat. No. 6,020,792, which is a continuation-in-part of application No. 09/205,758, filed on Dec. 4, 1998, now Pat. No. 6,052,035.

(51) Int. Cl.[7] .............................................. H03K 3/0231
(52) U.S. Cl. .................. 331/176; 331/111; 331/143; 331/44; 331/66; 331/74
(58) Field of Search .......................... 331/74, 111, 143, 331/179, 44, 176, 175, 66

(56) References Cited

U.S. PATENT DOCUMENTS

| | | | |
|---|---|---|---|
| 5,352,934 A | * | 10/1994 | Khan |
| 5,563,928 A | | 10/1996 | Rostoker et al. |
| 5,604,427 A | | 2/1997 | Kimura |
| 5,699,024 A | | 12/1997 | Manlove et al. |
| 5,912,593 A | | 6/1999 | Susak et al. |
| 6,020,790 A | | 2/2000 | Jackson et al. |
| 6,052,035 A | | 4/2000 | Nolan et al. |

FOREIGN PATENT DOCUMENTS

| | | |
|---|---|---|
| EP | 0 944 169 A2 | 9/1999 |
| WO | WO 00/36745 A1 | 6/2000 |

* cited by examiner

*Primary Examiner*—Arnold Kinkead
(74) *Attorney, Agent, or Firm*—Baker Botts L.L.P.

(57) ABSTRACT

Several calibration techniques for a precision relaxation oscillator with temperature compensation produces a stable clock frequency over wide variations of ambient temperature. The calibration techniques provide for different methods of determining CTAT current, PTAT current or the ratio of PTAT current to CTAT current. The calibration techniques provide different methods for determining CTAT and PTAT calibration values and for setting CTAT and PTAT calibration select switches.

17 Claims, 9 Drawing Sheets

Fig. 10 ial application and the previous continuation-in-part application are assigned to the same assignee as the present application and there was at least one common inventor with the present application. U.S. patent applications Ser. No. 09/044,361, now U.S. Pat. No. 6,020,792 filed Mar. 19, 1998 and Ser. No. 09/205,758, now U.S. Pat. No. 6,052,035, filed Dec. 4, 1998, are incorporated by reference.

CALIBRATION TECHNIQUES FOR A PRECISION RELAXATION OSCILLATOR INTEGRATED CIRCUIT WITH TEMPERATURE COMPENSATION

CROSS-REFERENCE TO RELATED APPLICATIONS

This application is a continuation-in-part of U.S. patent application Ser. No. 09/044,361, filed Mar. 19, 1998, entitled "A Precision Relaxation Oscillator With Temperature Compensation" now U.S. Pat. No. 6.020,792, U.S. patent application Ser. No. 09/205,758, filed Dec. 4, 1998, entitled "A Precision Relaxation Oscillator With Temperature Compensation and Various Operating Modes" now U.S. Pat. No. 6,052,035, was also a continuation-in-part of U.S. patent application Ser. No. 09/044,361, now U.S. Pat. No. 6,020, 792, filed Mar. 19, 1998, entitled "A Precision Relaxation Oscillator With Temperature Compensation." The parent application and the previous continuation-in-part application are assigned to the same assignee as the present application and there was at least one common inventor with the present application. U.S. patent applications Ser. No. 09/044,361, now U.S. Pat. No. 6,020,792 filed Mar. 19, 1998 and Ser. No. 09/205,758, now U.S. Pat. No. 6,052,035, filed Dec. 4, 1998, are incorporated by reference.

BACKGROUND OF THE INVENTION

1. Field of the Invention

This invention relates generally to integrated circuits which produce clock frequencies. Specifically, the present invention provides for inter-related calibration techniques for a precision relaxation oscillator that produces a stable clock frequency over wide variations of ambient temperature, fabrication process and voltage. The invention is implemented on a single, monolithic integrated circuit.

2. Description of the Prior Art

The current state of the art describes RC relaxation oscillators which primarily depend on one of two schemes. In the first example as found in FIG. 1, a single comparator is coupled to a pulse generator to alternately charge and discharge a capacitor to produce a clock for a "D type" flip-flop. Several error sources are present in this design. The resistor and capacitor typically have unpredictable voltage and temperature coefficients. The charging current and comparator input slew are a function of the supply voltage which is also subject to drift. Also, the pulse generator output may vary with temperature and supply voltage. These factors lead to a clock frequency that varies over temperature.

Figure 1:
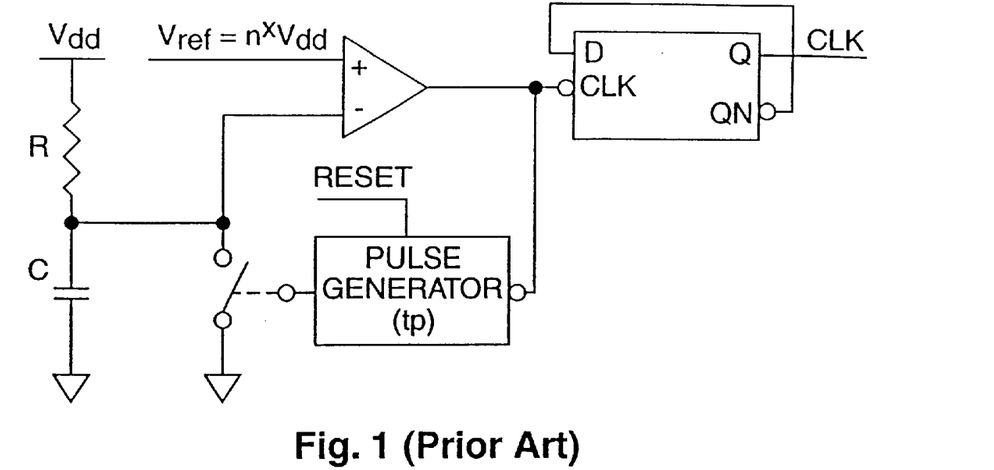
FIG. 1 is a schematic diagram of the prior art showing a simple RC Relaxation Oscillator with a pulse generator.
Figure 2:
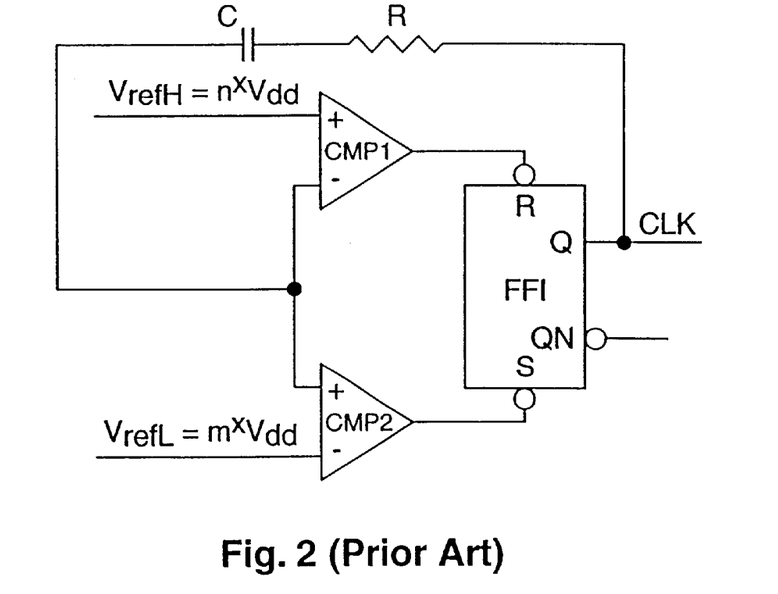
FIG. 2 is a schematic diagram of the prior art showing a dual comparator RC Relaxation Oscillator.

In a second example as illustrated in FIG. 2, an RC circuit provides a common input to each of two comparators. Independent reference voltages are coupled to each of the remaining inputs of the comparators. The outputs of each of the two comparators are coupled to the inputs of a "Set-Reset type" flip-flop. The output of the flip-flop serves to alternately charge and discharge the capacitor. Although this circuit eliminates the inaccuracies of the pulse generator as discussed above in FIG. 1, other problems manifest themselves. A duty cycle error may occur since it is unlikely that the capacitor will charge and discharge at the same rate, especially over temperature variations. Also, error is induced by the difficulty of providing two reference voltages which track each other coincidently over temperature.

Therefore, a need existed to provide a relaxation oscillator which is capable of maintaining a stable clock frequency independent of temperature. Furthermore, a need existed to provide a calibration technique for trimming the relaxation oscillator for a target clock frequency to compensate for process variations.

BRIEF SUMMARY OF THE INVENTION

It is the objective of the present invention to provide several calibration techniques which all have the common goal of providing a capacitor charging current for achieving a target clock frequency and for optimizing a temperature coefficient of the relaxation oscillator circuit.

It is an object of the present invention to provide an independent current calibration technique which independently sets CTAT current to a pre-determined value and sets PTAT current to zero or approximately zero. In at least one embodiment, the PTAT current generator may be omitted from the circuit altogether. In a variation of this calibration technique, it is the object of the invention to independently set PTAT current to a pre-determined value and set CTAT current to zero or approximately zero. In this variation, the CTAT current generator may be omitted. It is further the object of the independent current calibration technique that the CTAT (or PTAT) calibration values be stored in non-volatile memory.

It is another object of the present invention to provide a fixed compensation calibration technique which computes a mean PTAT current for a population of devices from a random sample of the population, computes the PTAT calibration values for determining the mean PTAT current in a device exhibiting mean performance and applying those PTAT calibration values to the entire population of devices. It is further the object of the fixed compensation calibration technique that the CTAT calibration values be stored in non-volatile memory and the PTAT calibration values be hardwired to appropriate logic levels.

It is another object of the present invention to provide a variable compensation calibration technique for a precision oscillator with temperature compensation which computes a mean PTAT current for a population of devices from a random sample of the population, computes the PTAT calibration values for determining the mean PTAT current in each device within the population and applies the individually computed PTAT calibration values to each device in the population. It is further the object of the variable compensation calibration technique that the CTAT and PTAT calibration values be stored in non-volatile memory.

It is another object of the present invention to provide a fixed ratio calibration technique for a precision oscillator with temperature compensation which computes a mean PTAT:CTAT current ratio for a population of devices from a random sample of the population, computes the PTAT and CTAT calibration values for determining the mean PTAT current in a device exhibiting mean performance and applying those PTAT and CTAT calibration values to the entire population of devices. It is further the object of the fixed ratio calibration technique that the CTAT calibration values be stored in non-volatile memory and that the PTAT calibration values be decoded from the CTAT calibration values.

It is another object of the present invention to provide a variable ratio calibration technique for a precision oscillator with temperature compensation which computes the temperature coefficients for the PTAT current generator and the CTAT current generator by taking current measurements at two distinct temperatures for each device in the population, deriving the PTAT:CTAT current ratio from the ratio of the temperature coefficients, computing the PTAT and CTAT calibration values for determining the PTAT and CTAT currents in each device and applying the independently calculated PTAT and CTAT calibration values to each device in the population. It is further the object of the variable ratio calibration technique that the CTAT and PTAT calibration values be stored in non-volatile memory.

In accordance with one embodiment of the present invention, a precision relaxation oscillator that produces a stable clock frequency over wide variations of ambient temperature is disclosed. The precision relaxation oscillator is comprised of an oscillation generator, a first current generator for producing a first output current and a second current generator for producing a second output current. The invention is implemented on a single, monolithic integrated circuit.

In accordance with the independent current calibration method of the present invention, the CTAT current is set to a predetermined value at a nominal temperature and PTAT current is set to zero or approximately zero. Alternatively, the PTAT current is set to a predetermined value at a nominal temperature and CTAT current is set to zero or approximately zero.

In accordance with the fixed compensation method of the present invention, the mean PTAT current is computed for a random sample of a population of devices at a nominal temperature. The calibration values for setting the PTAT calibration select switches are computed for setting mean PTAT current in those devices exhibiting mean performance. The computed calibration values are stored in each device of the population. The CTAT calibration values are computed on a device by device basis for achieving a CTAT current such that the sum of the PTAT current and the CTAT current corresponds to a capacitor charging current for a target clock frequency.

In accordance with variable compensation method of the present invention, the mean PTAT current is computed for a random sample of a population of devices at a nominal temperature. The calibration values for setting the PTAT calibration select switches are individually computed for setting mean PTAT current in each device of the population. The CTAT calibration values are computed on a device by device basis for achieving a CTAT current such that the sum of the PTAT current and the CTAT current corresponds to a capacitor charging current for a target clock frequency.

In accordance with fixed ratio method of the present invention, the mean ratio of PTAT:CTAT current is computed for a random sample of a population of devices at a nominal temperature. The calibration values for setting the PTAT and CTAT calibration select switches are individually computed for setting the mean ratio of PTAT:CTAT current in each device of the population.

In accordance with variable ratio method of the present invention, the temperature coefficients for the PTAT current generator and the CTAT current generator are computed by taking current measurements at two distinct temperatures for each device in the population. The PTAT:CTAT current ratio for each device is derived from the ratio of the temperature coefficients. The PTAT and CTAT calibration values for determining the PTAT and CTAT currents in each device are computed and applied to each device in the population.

The foregoing and other objects, features, and advantages of the invention will be apparent from the following, more particular, description of the preferred embodiments of the invention, as illustrated in the accompanying drawings.

Table 1 illustrates mean, minimum and maximum values for independent process variation parameters which effect oscillation frequency. The values contained within this table are typical for a target clock frequency of 4 MHz.

Table 2 identifies several calibration techniques and associated dependent parameters for relaxation oscillators fabricated with polysilicon resistors. The table illustrates mean, minimum and maximum values for the dependent parameters. The values contained within this table are typical for a target clock frequency of 4 MHz.

Table 3 identifies several calibration techniques and associated dependent parameters for relaxation oscillators fabricated with diffused resistors. The table illustrates mean, minimum and maximum values for the dependent parameters. The values contained within this table are typical for a target clock frequency of 4 MHz.

DETAILED DESCRIPTION OF THE INVENTION

Figure 3:
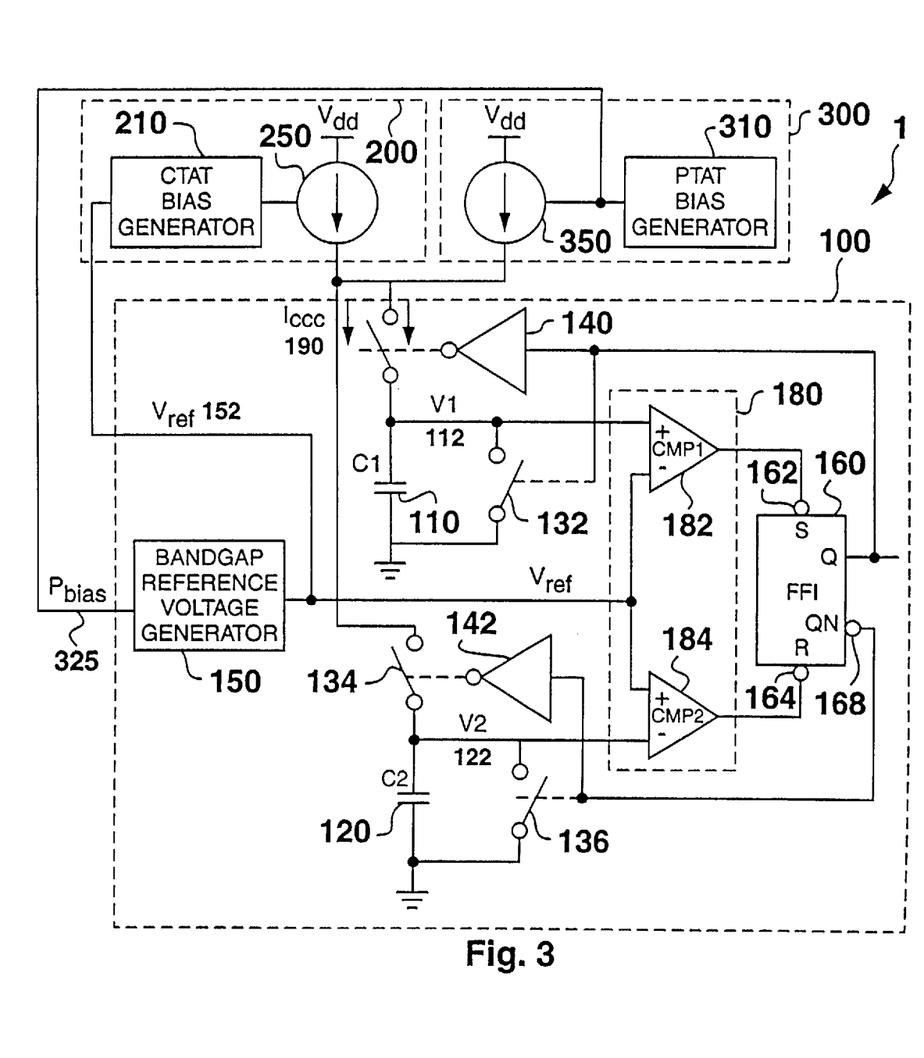
FIG. 3 is a block diagram of the present invention.

Referring to FIG. 3, a precision relaxation oscillator 1 that produces a stable clock frequency over wide variations of ambient temperature is shown. Preferably, the precision relaxation oscillator 1 produces a stable clock frequency in the range of approximately 1 KHz to 8 MHz. However, those skilled in the art will recognize that the present invention is not limited to a specific frequency range.

The precision relaxation oscillator 1 is comprised of an oscillation generator 100, a first current generator 200 which is typically a Complementary to Absolute Temperature (CTAT) current generator and a second current generator 300 which is typically a Proportional to Absolute Temperature (PTAT) current generator. In the preferred embodiment of the present invention, the precision relaxation oscillator 1 is implemented on a single, monolithic integrated circuit.

The CTAT 200 and PTAT 300 current generators are independently implemented and yield several important functions to the present invention. The CTAT 200 and PTAT 300 current generators compensate for the effects that temperature variation has on the internal components of the device such as resistors, capacitors and comparators by providing offsetting currents CTAT current 220 and PTAT current 320, i.e. currents with opposite slopes with respect to temperature. CTAT current 290 and PTAT current 390 (FIGS. 4 & 5) are combined to form a capacitor charging current $I_{ccc}$ 190 ($I_{ccc}$ 190=CTAT current 290+PTAT current 390). The combining, or summing of the CTAT current 290 and PTAT current 390 occurs when introduced to the oscillation generator 100 for charging a first capacitor 110 and a second capacitor 120. Because the CTAT 290 and PTAT 390 currents are approximately linear and of opposite slope with respect to temperature, the result of the summation is an $I_{ccc}$ 190 that is nearly independent of temperature.

In the preferred embodiment, the oscillation generator 100 is comprised of a set-reset flip-flop 160, a comparator circuit 180 further comprised of two comparators 182 & 184, two capacitors 110 & 120, four transistor switches 130, 132, 134 & 136, two inverters 140 & 142 and a bandgap reference voltage circuit 150 for producing a reference voltage 152.

The transistor switches 130 & 134 provide charging paths for the capacitors 110 & 120, respectively. The transistor switches 132 & 136 provide discharging paths for the capacitors 110 & 120, respectively. In the preferred embodiment, the transistor switches 130, 132, 134 and 136 are MOSFET transistors, however, those skilled in the art will recognize that the invention is not limited to this technology.

The oscillation generator 100 operates by having one capacitor charge while the other capacitor discharges. The discharge path for the capacitor 110 is connected via transistor switch 132 to an input of the comparator 182. The discharge path for the capacitor 120 is connected via transistor switch 136 to an input of the comparator 184.

In the preferred embodiment and for best performance, a stable reference voltage source such as a bandgap reference voltage circuit 150 is used. The bandgap reference voltage circuit 150 provides a single reference voltage 152, which is connected to second inputs of comparators 182 & 184, and is used to set the common mode voltage at each comparator 182 & 184 and at the CTAT current generator 200. The $P_{BIAS}$ input 325 for the bandgap reference voltage circuit 150 is an output of the PTAT bias generator 310 which is described below. The bandgap reference voltage circuit 150 has the advantage of stabilizing capacitor charging current and minimizing the error due to variance in comparator input slew and propagation delay. Furthermore, in order to cancel, or at the very least minimize, the effects of reference voltage drift, the CTAT 200 current generator relies on the same reference voltage 152 as the comparators 182 & 184. For example, if the reference voltage 152 increases, the CTAT current 290 (FIG. 4), which is equal to $V_{REF}/R$, also increases. Without compensation elsewhere, this increased CTAT current 290 would result in a faster clock frequency 166, because a greater $I_{ccc}$ 190 is produced, which results in faster charging of the capacitors 110 and 120. However, the capacitors 110 and 120 must charge to a greater level for the comparators 182 and 184 to trip with respect to the increased reference voltage 152. Thus, the present invention requires a simpler, lest costly reference voltage source to achieve clock frequency stability. There are various embodiments of the bandgap reference voltage circuit 150, as well as other reference voltage sources such as voltage dividers, which are well known to those skilled in the art. However, the novel way in which the bandgap reference voltage circuit 150 is implemented in the present invention is not disclosed by the prior art.

The output of comparator 182 is connected to the set input 162 of the flip-flop 160. The output of comparator 184 is connected to the reset input 164 of the flip-flop 160. Thus, as the capacitors 110 and 120 alternatively charge and discharge, the outputs of the comparators 182 & 184 alternatively set and reset the flip-flop 160 thus producing a clock output.

The Q output 166 of the flip-flop 160 provides a stable clock frequency that is independent of temperature variation. In the preferred embodiment, the Q output 166 is also routed to transistor switch 132 and via inverter 140 to transistor switch 130. Thus the Q output 166 provides the signal that controls the transistor switches 130 & 132 which in turn open and close the charging and discharging paths for capacitor 110.

The complementary Q output 168 of flip-flop 160 provides a second stable clock frequency that is also independent of temperature and the complement of Q output 166. The complementary Q output 168 is routed to transistor switch 136 and via inverter 142 to transistor switch 134. Thus the complementary Q output 168 provides the signal that controls the transistor switches 134 & 136 which in turn open and close the charging and discharging paths for capacitor 120.

Figure 4:
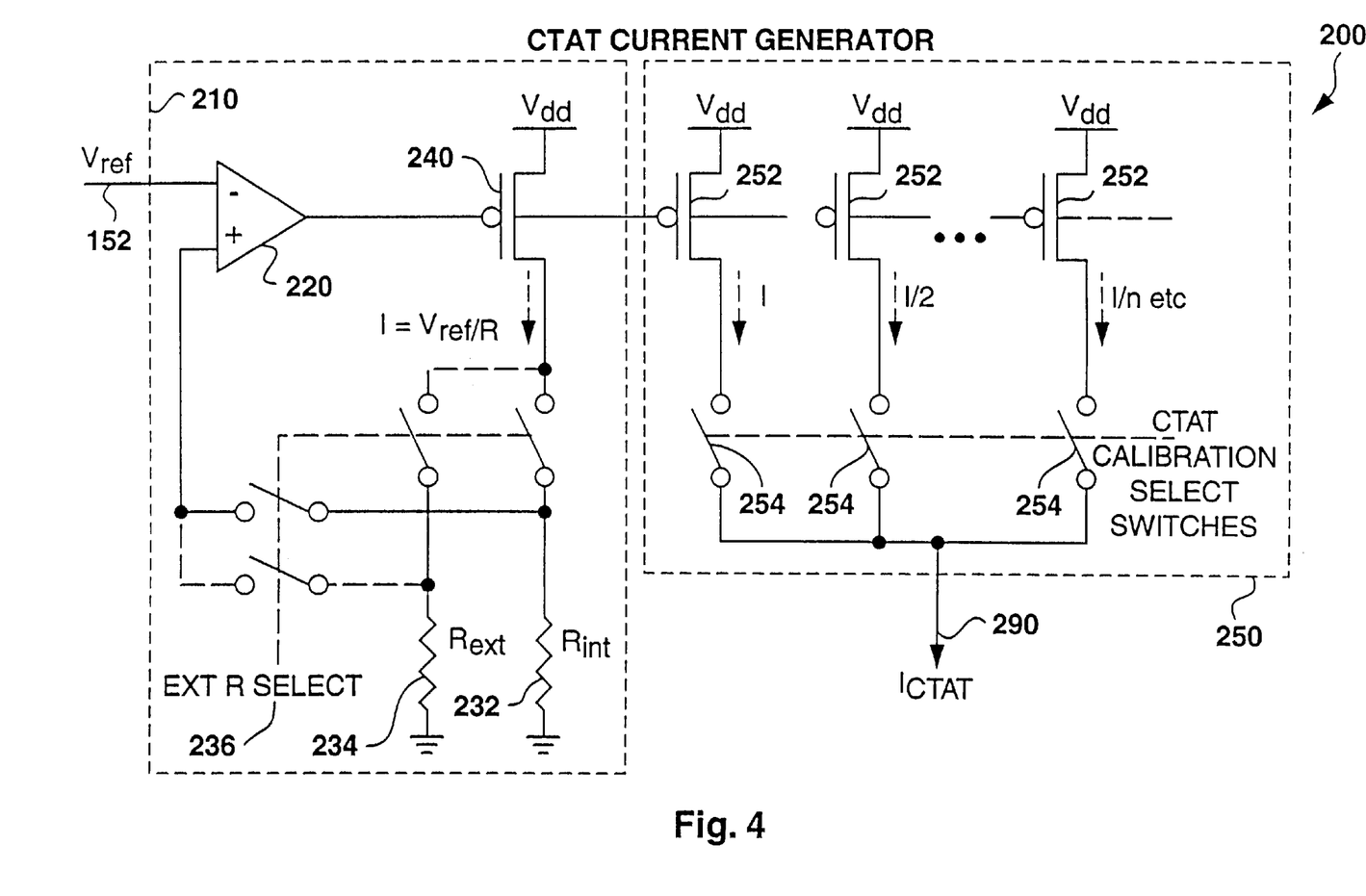
FIG. 4 is a block diagram of the CTAT current generator found in the present invention.

Referring to FIG. 4, wherein like numerals reflect like elements, the CTAT current generator 200 is comprised of a CTAT bias generator 210 and a current mirror 250 for producing the CTAT current 290. The CTAT bias generator 210 is comprised of an amplifier circuit 220, at least one resistor 232 & 234 with a small positive temperature coefficient for regulating the input current to the amplifier and a transistor 240 for providing an input current to the amplifier 220. The amplifier 220 is a cascode configuration for supply and noise rejection. The reference voltage 152 is coupled to an input of the amplifier 220. The present invention provides that an external resistor 234 may be selected over the internal resistor 232 by a select bit 236 for controlling the current sent to the current mirror 250 and thus, for producing a stable clock frequency independent of temperature.

The current mirror 250 is comprised of a plurality of transistors 252 from one to n. The output the CTAT bias generator amplifier 220 is coupled to the current mirror transistors 252. Trimming the CTAT current 290 for achieving the proper CTAT:PTAT balance is programmed digitally by selecting or enabling one or more of the current mirror transistors 252 via the calibration select switches 254, which would sum, to obtain the desired CTAT current 290. In the preferred embodiment, the current mirror 250 acts as a current divider which is well known to those skilled in the art. In other embodiments the current mirror 250 may be configured as a current multiplier. The CTAT current 290 is the sum of the selected outputs from the current mirror transistors 252.

Figure 5:
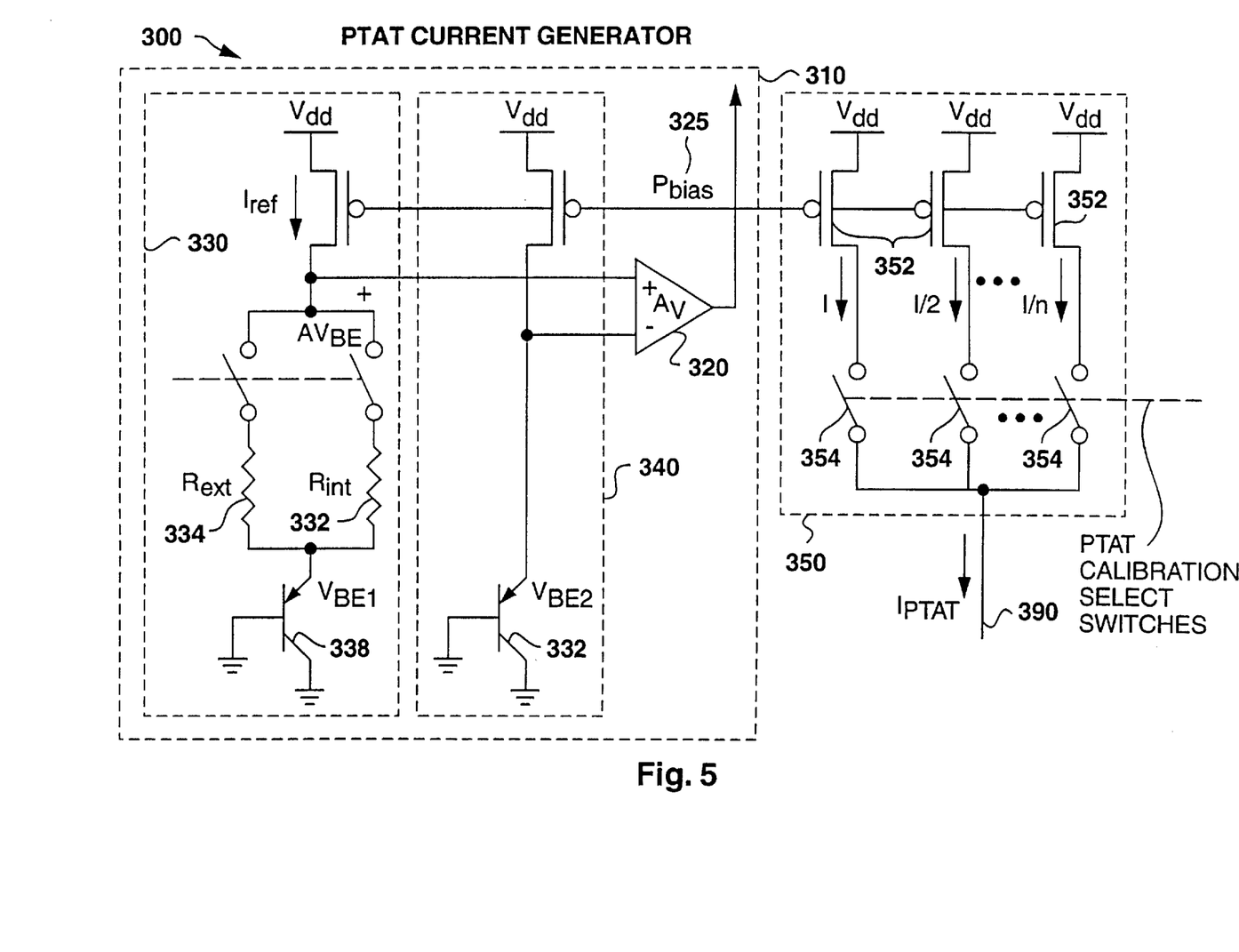
FIG. 5 is a block diagram of the PTAT current generator found in the present invention.

Referring to FIG. 5, wherein like numerals reflect like elements, the PTAT current generator 300, known to those skilled in the art as a $\Delta V_{BE}$ circuit, is comprised of PTAT bias generator 310 and a PTAT current mirror 350 for producing a PTAT current 390. The PTAT bias generator 310 is comprised of an amplifier circuit 320, a first bias circuit 330 for producing a first bias voltage across a selectable resistor with a small linear temperature coefficient 332 or 334 and a second bias circuit 340 for producing a second bias voltage. The first and second bias voltages provide the inputs to the amplifier 320. The output of the amplifier 320 PBIAS 325 which is coupled to the first 330 and second 340 bias circuits, the PTAT current mirror 350 and the bandgap reference voltage generator 150 (FIG. 1). Similar to the CTAT current generator 200, the present invention provides that an external resistor 334 may be selected over the internal resistor 332 by a select bit 336 for controlling the current sent to the current mirror 350 and thus, for producing a stable clock frequency independent of temperature.

The PTAT current mirror 350 is comprised of a plurality of transistors 352 from one to n. Trimming is performed digitally by programming the selection or enablement of one or more of the current mirror transistors 352 via the calibration select switches 354 to obtain the desired PTAT current 390. In the preferred embodiment, the current mirror 350 acts as a current divider which is well known to those skilled in the art. In other embodiments the current mirror 350 may be configured as a current multiplier. The PTAT current 390 is the sum of the selected outputs from the current mirror transistors 352.

Figure 6:
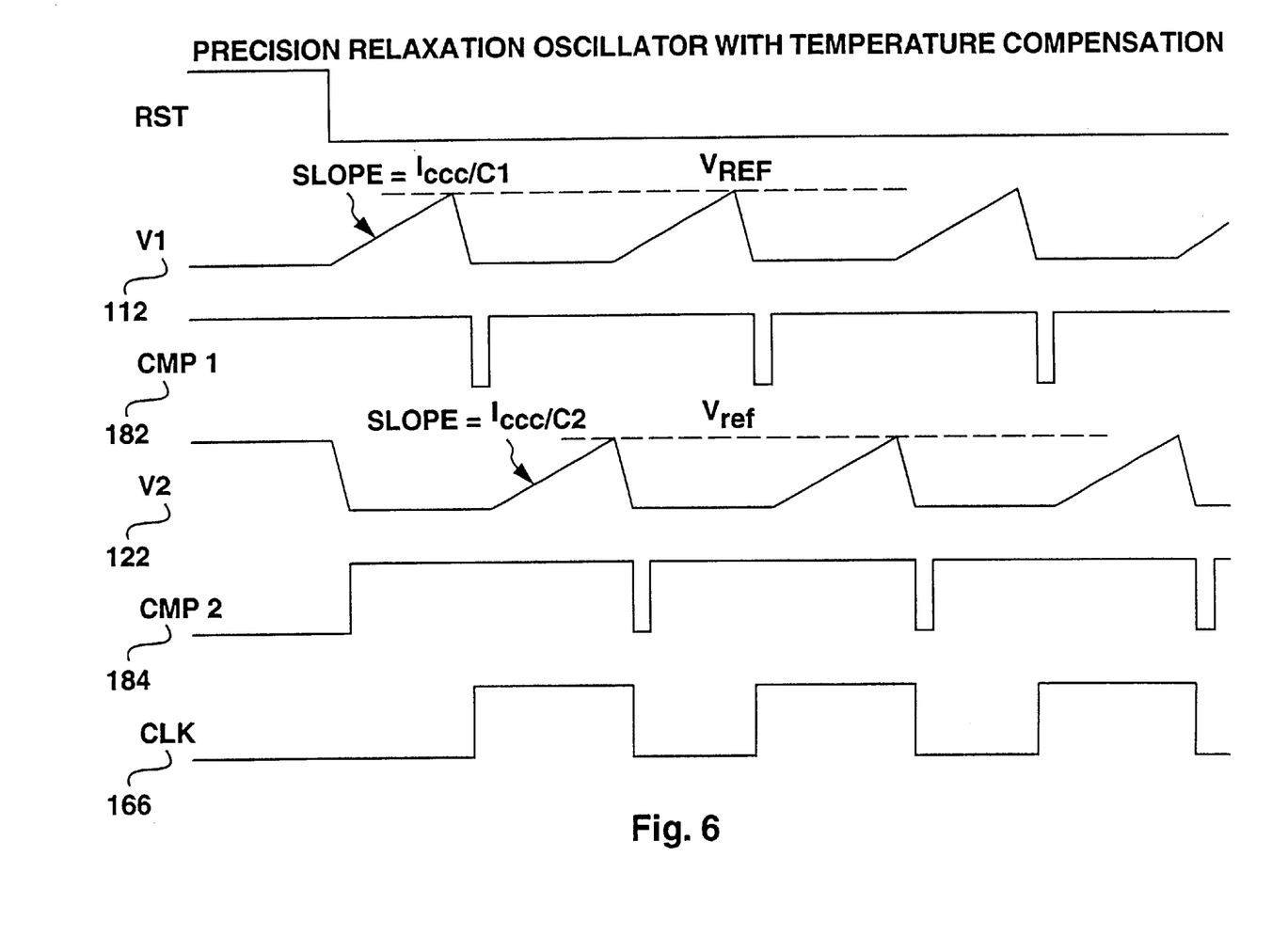
FIG. 6 is a timing diagram of specific parameters of the present invention.

Referring to FIG. 6, wherein like numerals reflect like elements, a timing diagram for the relaxation oscillator 1 is shown. V1 112 reflects the charging and discharging of capacitor 110 (FIG. 1). Note that the positive slope (charging) of V1 112 is equal to $I_{ccc}$ 190 divided by the capacitance of capacitor 110. The maximum amplitude of V1 112 is equal to the reference voltage 152. CMP1 reflects the output of the comparator 182 which is coupled to the set input 162 of the flip-flop 160.

V2 122 reflects the charging and discharging of capacitor 120. In this case the positive slope of V2 122 is equal to $I_{ccc}$ 190 divided by the capacitance of capacitor 120. CMP2 reflects the output of the comparator 184 which is coupled to the reset input 164 of the flip-flop 160. CLK is the Q output 166 of the flip-flop 160.

For a 50 percent duty cycle, the values of capacitors 110 & 120 are identical which result in similar slopes for V1 112 and V2 122. As the capacitor voltage exceeds the reference voltage 152, the respective comparator 182 & 184 pulses low which causes the flip-flop 160 to change state. RST (reset) is used to initialize the comparators 182 & 184 and the flip-flop 160 to a known state.

There are several calibration techniques used to set $I_{CTAT}$ 290, $I_{PTAT}$ 390 and thus, $I_{ccc}$ 190 for the present invention 1 of FIGS. 3, 4 and 5. The various calibration techniques, and the parameters associated with each technique, are set forth in Tables 1–3. Table 1 identifies the independent process parameters that impact clock frequency and frequency stabilization over temperature. Also, in Table 1 are the mean, minimum and maximum values of those parameters typically found in a population of devices. These independent parameters include a reference voltage as provided for by the bandgap reference voltage generator of the present invention, the temperature coefficient of the CTAT current generator, the temperature coefficient of the PTAT current generator and the value of the capacitors C1 and C2 (FIG. 3).

Tables 2 and 3 identify the various calibration techniques, the required capacitor charging current for a clock frequency of 4 MHz, the relevant calibration parameters for each of the techniques, and the resulting PTAT current and temperature coefficient of the device. Also included in Tables 2 and 3 are the mean, minimum and maximum values drawn from a random sample of the population of devices for each parameter. In Table 2, the values for the parameters represent the case of polysilicon resistors. Table 3 contains the values for the parameters in the case of diffused resistors. The values of the parameters contained in Tables 2 and 3 are typical for producing a target clock frequency of 4 MHz. Alternate clock frequencies would require different values of the relevant calibration parameters, however, the underlying concepts for each calibration technique remain valid.

The significance of the resistor type, i.e. polysilicon versus diffused, with respect to temperature coefficient was disclosed in great detail in U.S. patent application Ser. No. 09/205,758, filed Dec. 4, 1998, entitled "A Precision Relaxation Oscillator With Temperature Compensation and Various Operating Modes," which was a continuation-in-part of U.S. patent application Ser. No. 09/044,361, filed Mar. 19, 1998, entitled "A Precision Relaxation Oscillator With Temperature Compensation." As mentioned above in the case of target clock frequency, the values of the relevant calibration parameters are distinct for each resistor type. However, the underlying concepts for each of the calibration techniques discussed below are independent of resistor type. Furthermore, in the preferred embodiment, the CTAT current generator 200 and the PTAT current generator 300 have a common resistor type, i.e. either polysilicon or diffused.

In general terms and referring to FIGS. 7–10, wherein like numerals represent like elements, the calibration values for setting the CTAT calibration select switches 254 and consequently $I_{CTAT}$ 290, the dominant component of $I_{ccc}$ 190 in the preferred embodiment, are programmed on a device by device basis and stored in non-volatile memory 800. In other embodiments, the roles of CTAT and PTAT may be reversed. That is, in alternate embodiments $I_{PTAT}$ 390 is the dominant component of $I_{ccc}$ 190. The non-volatile memory is coupled to the CPU section 900 of the integrated circuit by an address bus (AB), data bus (DB) and control signals (CS).

The calibration values for setting the PTAT calibration select switches 354 and consequently $I_{PTAT}$ 390 may be computed on a device by device basis, as are the CTAT calibrations values. Alternatively, the PTAT calibration values may be derived from a random sample of devices from a population of devices, computing the mean or expected value of the PTAT calibration parameter for the particular technique and configuring each device in the population to the expected value, either by hardwiring the PTAT calibration select switches 354 or by storing the PTAT calibration values in non-volatile memory 800. By the approach of computing a mean from a random sample of a population, a normal distribution function of performance is achieved. However, in at least one technique, the PTAT calibration values are computed on a device by device basis. This is a more time consuming and thus, more costly approach. However, performance of the device is enhanced in terms of minimal variation of clock frequency over the population of devices.

Figure 7:
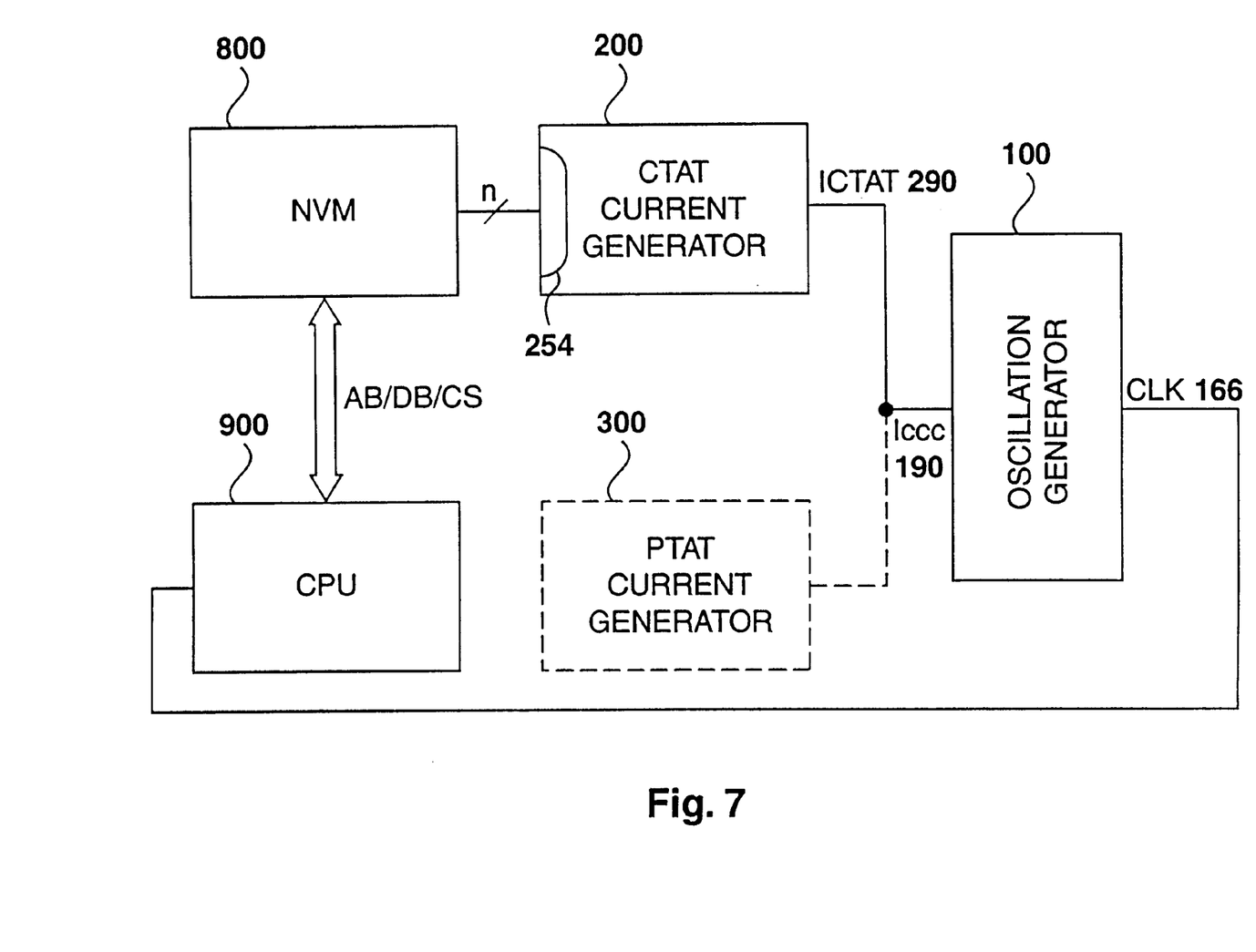
FIG. 7 is a block diagram of the present invention illustrating the optional PTAT current generator for the Independent Current calibration method.

Referring to FIG. 7, the simplest and least costly, but also least effective technique, is the independent current method which would trim $I_{CTAT}$ 290 to produce the target frequency at a nominal operating temperature. With this method there is no contribution from the PTAT current generator 300 and thus, $I_{PTAT}$ 390 is removed or set to zero. By removing the requirement for the PTAT current generator 300, the circuit is simplified. The dashed lines of the PTAT current generator 300 in FIG. 7 indicate that it is an optional component for the independent current method.

The downside of the independent current approach is that there is virtually no temperature compensation as the relaxation oscillator is completely subjected to the temperature coefficient of the resistors 232 and 234. Without temperature compensation there will be significant and undesirable fluctuations in $I_{ccc}$ 190 and clock frequency 166 over temperature depending on the resistor temperature coefficients. As shown in Table 2, the frequency error for polysilicon resistors is −300 ppm/deg C for a device at the expected value. A device with minimum deviation will still have a frequency error of −240 ppm/deg C. A device with maximum deviation will have a frequency error of −360 ppm/deg C. As shown in Table 3, the frequency errors are even greater because of the large temperature coefficient of the diffused resistor.

Figure 8:
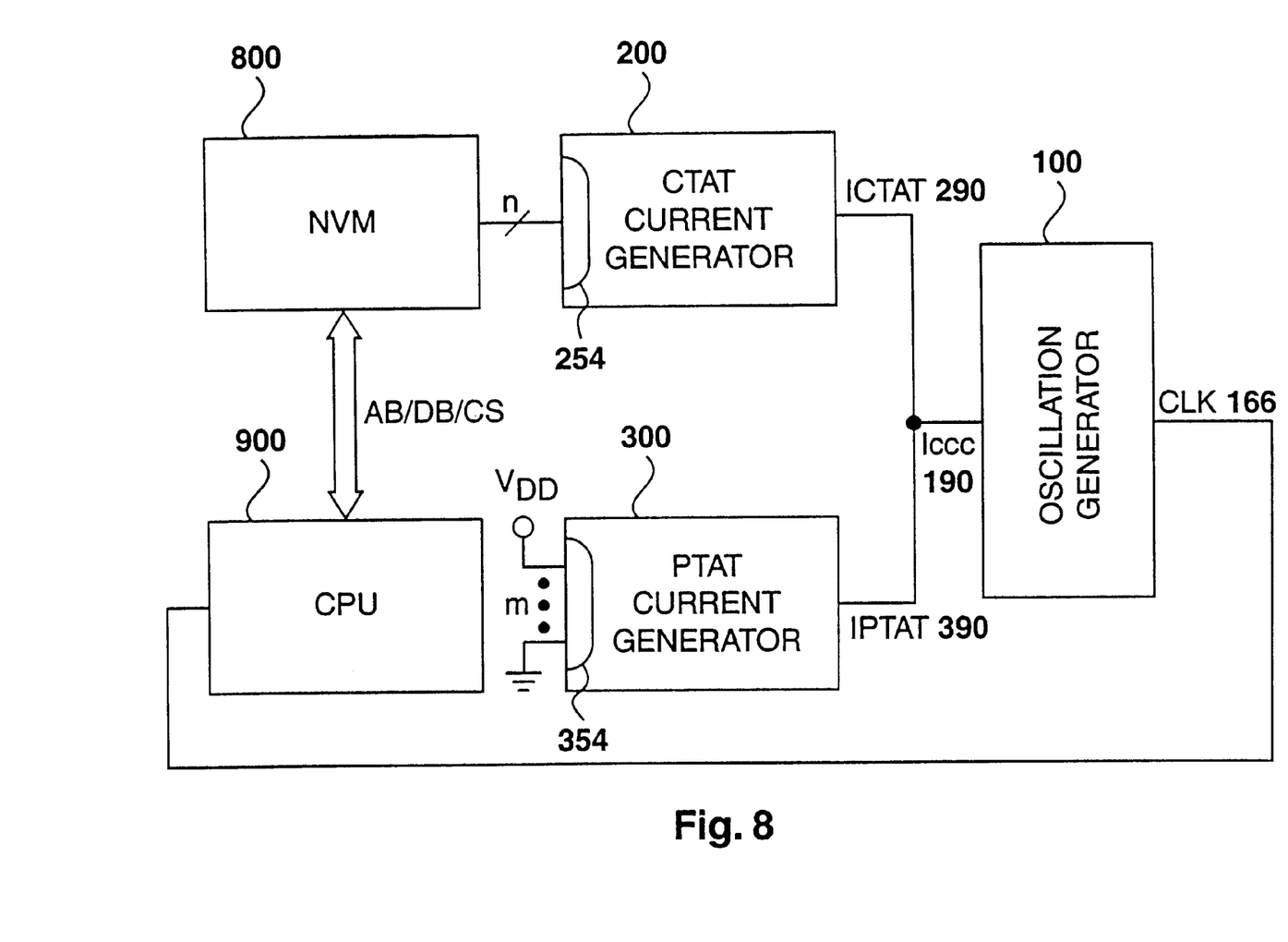
FIG. 8 is a block diagram of the present invention illustrating the hardwired PTAT calibration select switch option.

A second calibration technique, known as the fixed compensation method, adds the PTAT current generator 300 that has fusible or hardwired PTAT calibration select switches 354 as shown in FIG. 8. In the preferred embodiment, the PTAT calibration select switches 354 are hardwired to logic level 0 (typically ground potential) or logic level 1 (typically VDD).

Under the fixed compensation method, the expected value of $I_{PTAT}$ for the population is computed at nominal temperature (e.g. 25 deg. C.) from a random sample. The settings for the PTAT calibration select switches 354 are then determined to produce the required $I_{PTAT}$ 390 for those devices exhibiting mean PTAT current performance. The same settings for the PTAT calibration select switches 354 are applied to each device in the population.

The advantage to this technique is the addition of a stabilization current $I_{PTAT}$ 390 to $I_{ccc}$ 190 thereby yielding a more stable clock frequency over temperature than in the case of the independent current method. Furthermore, this technique is a cost effective solution to temperature calibration because a single set of PTAT calibration values is applied to all devices within the population. The time consuming process of unique settings for individual devices is avoided by this approach. Furthermore, cost savings are also realized by circumventing the requirement for non-volatile memory and decoding logic for PTAT calibration values found in other techniques.

The disadvantage to this approach is that the same PTAT calibration select switch 354 settings are used for all devices in the population regardless of independent process parameters. That is, identical settings for the PTAT calibration select switches may produce different currents in different devices because of process variation as shown in Tables 1 and 2. Thus some devices will be programmed more accurately than others.

Figure 9:
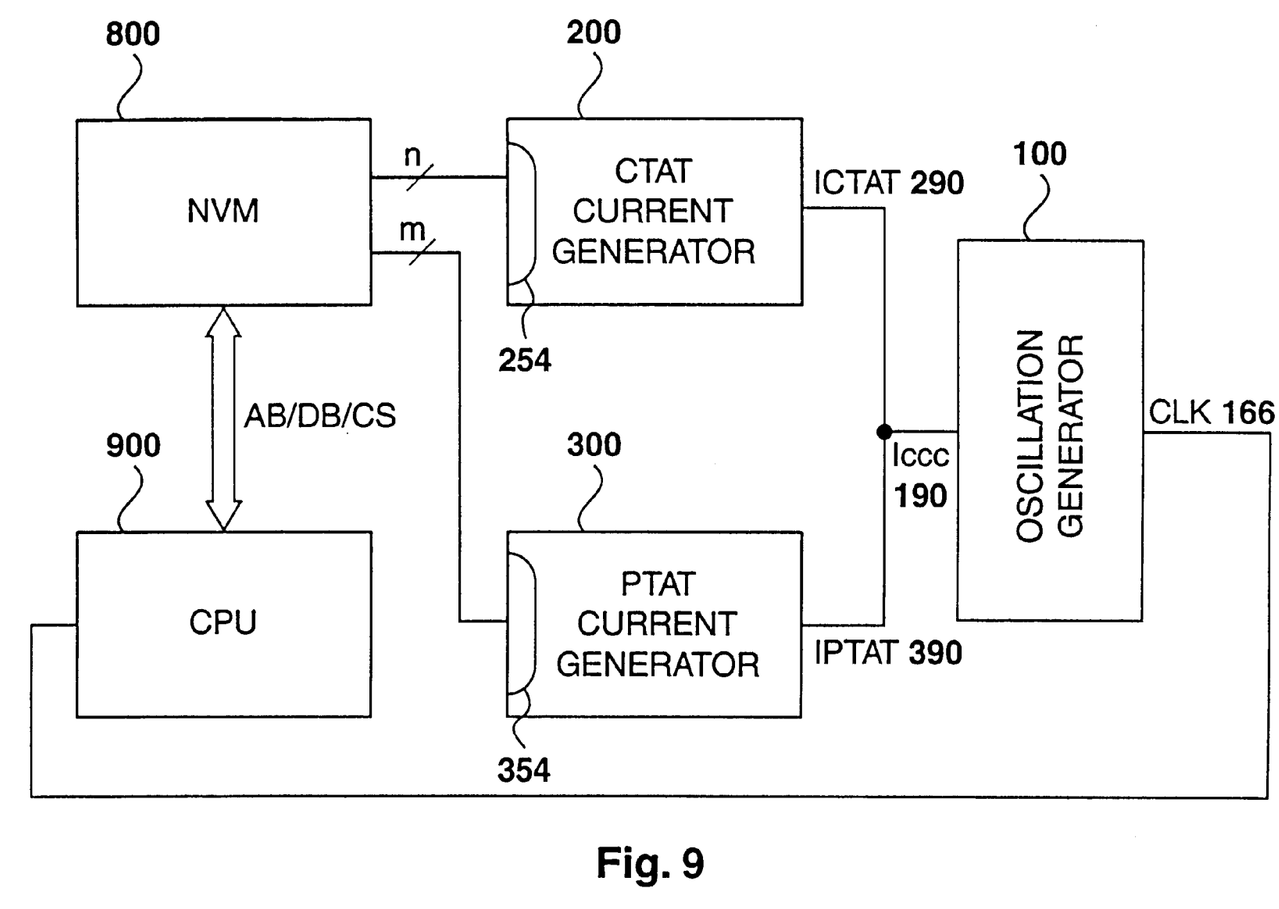
FIG. 9 is a block diagram of the present invention illustrating the two sets of calibration values stored in non-volatile memory, one set of calibration values for setting the CTAT calibration select switches and a second set of calibration values for setting the PTAT calibration select switches.

Another calibration technique offered by the present invention is the variable compensation method as shown in FIG. 9. The variable compensation method is characterized by the ability to maintain a constant $I_{PTAT}$ 390, typically in micro amperes, for each device within the population by varying the settings of the PTAT calibration select switches. As with the fixed compensation method, the expected value of $I_{PTAT}$ for the population is computed at nominal temperature from a random sample. However, in contrast to the fixed compensation method, the settings for the PTAT calibration select switches 354 are determined on a device by device basis to produce the mean $I_{PTAT}$ 390 in each device. Therefore, each device shown in FIG. 9 will have customized calibration values for the PTAT calibration select switches 354 which are stored in non-volatile memory 800 separately from the calibration values for the CTAT calibration select switches 254.

The advantage of the variable compensation method is superior frequency stabilization over the fixed compensation technique because each device in the population is independently calibrated to produce the mean $I_{PTAT}$ 390. However, because each device must be independently calibrated to set the mean $I_{PTAT}$ 390 and the PTAT calibration values must be separately stored in non-volatile memory 800, this technique adds cost and complexity to the relaxation oscillator.

Figure 10:
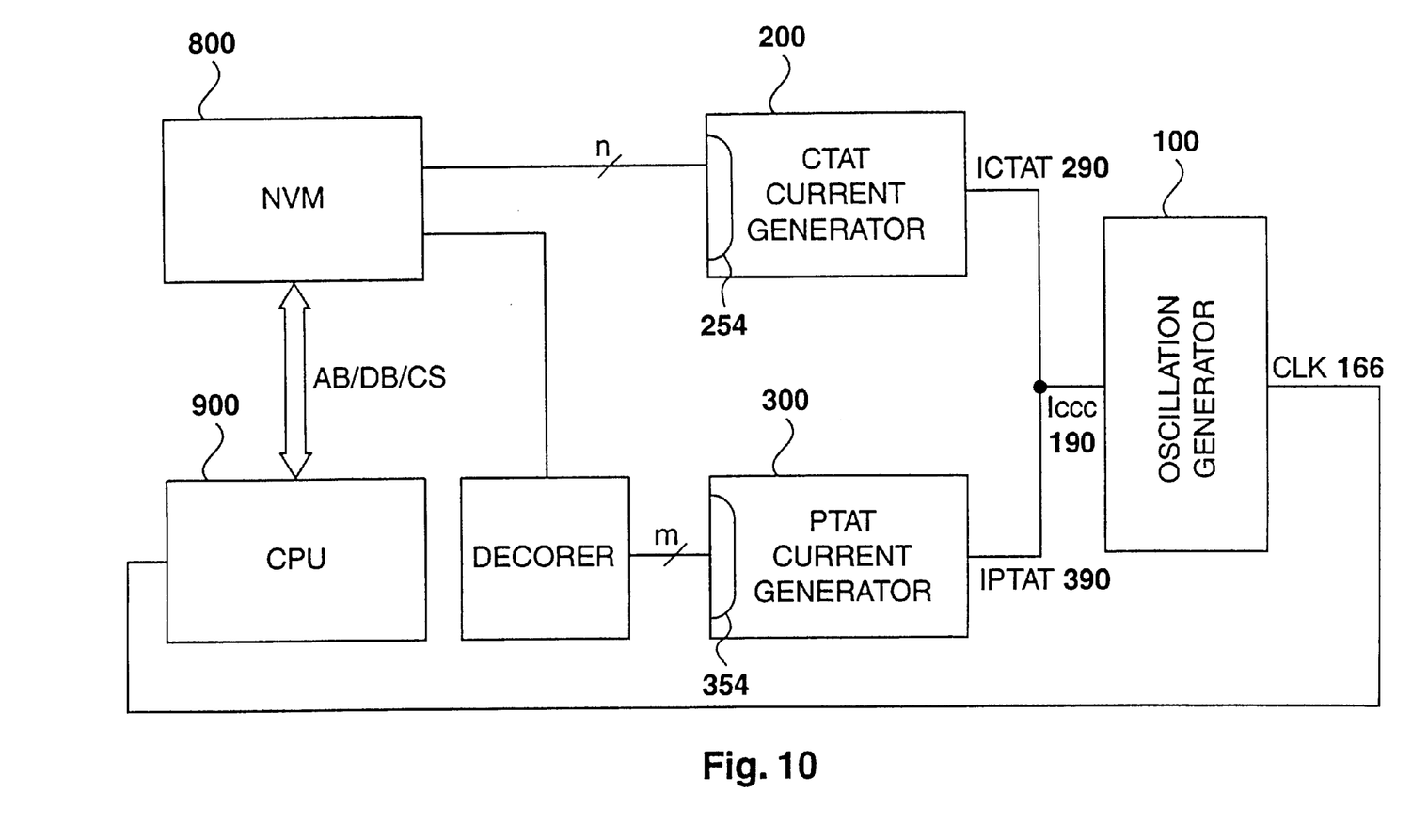
FIG. 10 is a block diagram of the present invention illustrating the single set of calibration values stored in non-volatile memory with the decoded PTAT calibration select switch option.

A calibration technique which provides for even greater clock frequency stabilization over temperature than the variable compensation method is the fixed ratio method shown in FIG. 10. With this method, the expected value of the $I_{PTAT}:I_{CTAT}$ ratio for the population is computed at nominal temperature from a random sample. In contrast to the methods discussed above where the relevant parameter was the magnitude of $I_{PTAT}$ 390, the relevant parameter for the fixed ratio method is the ratio of $I_{PTAT}$ to $I_{CTAT}$.

With the fixed ratio method, the CTAT current generator 200 and the PTAT current generator 300 share a common set of calibration values stored in non-volatile memory 800 as shown in FIG. 10. The PTAT calibration select switch settings 354 are derived from simple logic decoding 370 of the CTAT calibration values to achieve the mean $I_{PTAT}:I_{CTAT}$ ratio. Thus, each device uniquely decodes the CTAT calibration values for attaining the proper PTAT calibration values. By sharing a common set of calibration values as between the CTAT current mirror 250 and the PTAT current mirror 350, there is a savings in non-volatile memory incurred. Thus, the settings of the PTAT calibration select switches 354 are computed on a device by device basis such that each device in the population is programmed for the expected value of the $I_{PTAT}:I_{CTAT}$ ratio at nominal temperature as shown in Tables 1 and 2.

The final and most effective calibration technique is known as the variable ratio method. The hardware configuration for the variable ratio method is identical to that of the variable compensation method as shown in FIG. 9. However, the steps comprising the variable ratio method are unique from those comprising the variable compensation method. With the variable ratio method, the relaxation oscillator is calibrated for optimal $I_{PTAT}:I_{CTAT}$ ratio at two temperatures, as opposed to a single, nominal operating temperature. The following procedure is performed on a device by device basis.

Two temperature data points are established to compute the slope of the CTAT current over temperature by the following equation:

Slope $I_{CTAT}=\Delta I_{CTAT}/\Delta T$ where T=temperature in deg. C.

After computing the slope of $I_{CTAT}$ 290, the temperature coefficient of $I_{CTAT}$ is computed in accordance with the following:

Tempo ($I_{CTAT}$)=slope $I_{CTAT}/I_{CTAT.NM}$ where $I_{CTAT.NM}$=the CTAT current at 25 deg. C.

Similar calculations are performed to derive the temperature coefficient for $I_{PTAT}$ Next the value of the Tempo ($I_{PTAT}$):Tempo ($I_{CTAT}$) ratio is computed for each device. Finally the calibration values to produce $I_{PTAT}$ and $I_{CTAT}$ where the ratio of $I_{PTAT}:I_{CTAT}$ is consistent with the ratio of temperature coefficients is computed. These calibration values are stored separately in non-volatile memory as shown in FIG. 9. While the most accurate and effective, the variable ratio method is also the most complex and costly of the calibration techniques because calibration at two temperatures is required as well as a complex series of computations which are device dependent.

The present invention minimizes clock frequency drift due to fabrication process, supply voltage and temperature variances. This is accomplished by providing offsetting bias currents which when summed are independent of temperature variation, trimming via the programmable current mirrors 250 & 350 to eliminate process variations, using a stable voltage reference such as a bandgap reference voltage circuit 150 and a dual capacitor, dual comparator oscillation generator 100. The calibration techniques for trimming the bias currents to optimize performance include independent $I_{CTAT}$ fixed compensation, constant value, constant ratio and optimal ratio. Also, analog design techniques, well known to those skilled in the art, such as component matching and cascode current sources enhance the stability of the circuit.

Although the invention has been particularly shown and described with reference to a preferred embodiment thereof, it will be understood by those skilled in the art that changes in form and detail may be made therein without departing from the spirit and scope of the invention.

What is claimed is:

1. A calibration technique for a precision relaxation oscillator device having a temperature compensation circuit, said calibration technique comprising the steps of:

providing for a plurality of precision relaxation oscillator devices, each of the plurality of devices having a temperature compensation circuit, wherein the temperature compensation circuits form a population of circuits;

selecting a random sample of circuits from the population of circuits;

computing a mean PTAT current for the random sample of circuits at a nominal temperature for achieving a target clock frequency of the relaxation oscillator device and for optimizing a temperature coefficient of the circuit; and providing a capacitor charging current (Iccc) from the temperature compensation circuit for controlling the target clock frequency, wherein the capacitor charging current is comprised of a ratio of the mean PTAT current and a CTAT current.

2. A calibration technique for a precision relaxation oscillator device having a temperature compensation circuit, said calibration technique comprising the steps of;

providing for a plurality of precision relaxation oscillator devices, each of the plurality of devices having a temperature compensation circuit, wherein the temperature compensation circuits form a population of circuits;

selecting a random sample of circuits from the population of circuits;

computing a mean PTAT current for the random sample of circuits at a nominal temperature for achieving a target clock frequency of the relaxation oscillator device and for optimizing a temperature coefficient of the circuit; and providing a capacitor charging current (Iccc) from the temperature compensation circuit for controlling the target clock frequency, wherein the capacitor charging current is comprised of a sum of a PTAT current and a CTAT current.

3. The calibration technique in accordance with claim 2 further comprising the steps of:

determining PTAT calibration values for setting a plurality of PTAT calibration select switches in a circuit from the random sample of circuits having a mean PTAT current performance;

storing the PTAT calibration values for setting the plurality of PTAT calibration select switches in each circuit of the population;

reading the PTAT calibration values for setting the plurality of PTAT calibration select switches; and setting the plurality of the PTAT calibration select switches consistent with the PTAT calibration values.

4. The calibration technique in accordance with claim 3 further comprising the steps of:

computing the CTAT current for approximating the target clock frequency;

determining CTAT calibration values for setting a plurality of CTAT calibration select switches;

storing the CTAT calibration values for setting the plurality of CTAT calibration select switches;

reading the CTAT calibration values for setting the plurality of CTAT calibration select switches; and setting the plurality of the CTAT calibration select switches consistent with the CTAT calibration values.

5. The calibration technique in accordance with claim 4 wherein;

the PTAT calibration values for setting the plurality of PTAT calibration select switches are hardwired to a logic level; and the CTAT calibration values for setting the plurality of CTAT calibration select switches are stored in non-volatile memory.

6. The calibration technique in accordance with claim 2 further comprising the steps of;

determining PTAT calibration values for setting a plurality of PTAT calibration select switches for each circuit within the population wherein the setting of the plurality of PTAT calibration select switches produces the mean PTAT current for each circuit within the population;

storing the PTAT calibration values for setting the plurality of PTAT calibration select switches;

reading the PTAT calibration values for setting the plurality of PTAT calibration select switches;

setting the plurality of the PTAT calibration select switches consistent with the PTAT calibration values.

7. The calibration technique in accordance with claim 6 further comprising the steps of:

computing the CTAT current for approximating the target clock frequency;

determining CTAT calibration values for setting a plurality of CTAT calibration select switches;

storing the CTAT calibration values for setting the plurality of CTAT calibration select switches;

reading the CTAT calibration values for setting the plurality of CTAT calibration select switches; and setting the plurality of the CTAT calibration select switches consistent with the CTAT calibration values.

8. The calibration technique in accordance with claim 7 wherein:

the CTAT calibration values for setting the plurality of CTAT calibration select switches are stored in a first non-volatile memory location; and the PTAT calibration values for setting the plurality of PTAT calibration select switches are stored in a second non-volatile memory location.

9. The calibration technique in accordance with claim 2 further comprising the steps of:

computing a mean $I_{PTAT}:I_{CTAT}$ current ratio for the random sample of circuits at a nominal temperature for achieving the target clock frequency and for optimizing a temperature coefficient of the circuit;

determining PTAT calibration values for setting a plurality of PTAT calibration select switches for each circuit within the population wherein the setting of the plurality of PTAT calibration select switches corresponds to the mean $I_{PTAT}$:$I_{CTAT}$ current ratio for each circuit within the population;

decoding the PTAT calibration values from the CTAT calibration values for setting the plurality of PTAT calibration select switches; and setting the plurality of the PTAT calibration select switches consistent with the PTAT calibration values.

10. The calibration technique in accordance with claim 9 further comprising the steps of:

computing the CTAT current for approximating the target clock frequency;

determining CTAT calibration values for setting a plurality of CTAT calibration select switches;

storing the CTAT calibration values for setting the plurality of CTAT calibration select switches;

reading the CTAT calibration values for setting the plurality of CTAT calibration select switches; and setting the plurality of the CTAT calibration select switches consistent with the CTAT calibration values.

11. The calibration technique in accordance with claim 10 wherein:

the CTAT calibration values for setting the plurality of CTAT calibration select switches are stored in a non-volatile memory location; and the PTAT calibration values for setting the plurality of PTAT calibration select switches are stored in the non-volatile memory location.

12. A calibration technique for a precision relaxation oscillator device having a temperature compensation circuit, said calibration technique comprising the steps of:

providing a capacitor charging current (Iccc) from the temperature compensation circuit for producing a target clock frequency wherein the capacitor charging current is comprised of a sum of a CTAT current and a PTAT current;

computing a slope of the CTAT current with respect to temperature;

computing a CTAT temperature coefficient of the CTAT current from the slope of the CTAT current;

computing a slope of the PTAT current with respect to temperature;

computing a PTAT temperature coefficient of the PTAT current;

computing a ratio of the PTAT temperature coefficient to the CTAT temperature coefficient:

computing a ratio of PTAT current to CTAT current;

determining CTAT calibration values for setting a plurality of CTAT calibration select switches for producing the CTAT current and determining PTAT calibration values for setting a plurality of PTAT calibration select switches for producing the PTAT current wherein a ratio of the PTAT current to the CTAT current is approximately equal to the ratio of the PTAT temperature coefficient to the CTAT temperature coefficient;

storing the CTAT calibration values for setting the plurality of CTAT calibration select switches;

storing the PTAT calibration values for setting the plurality of PTAT calibration select switches;

reading the CTAT calibration valies for setting the plurality of CTAT calibration select switches;

reading the PTAT calibration values for setting tide plurality of PTAT calibration select switches;

setting the plurality of CTAT calibration select switches consistent with the CTAT calibration values; and setting the plurality of PTAT calibration select switches consistent with the PTAT calibration values.

13. The calibration technique in accordance with claim 12 wherein:

the CTAT calibration values for setting the plurality of CTAT calibration select switches are stored in a first non-volatile memory location; and the PTAT calibration values for setting the plurality of PTAT calibration select switches are stored in a second non-volatile memory location.

14. The calibration technique in accordance with claim 1 further comprising the steps of:

computing the CTAT current for the target clock frequency;

determining CTAT calibration values for setting a plurality of CTAT calibration select switches;

storing the CTAT calibration values for setting the plurality of CTAT calibration select switches;

reading the CTAT calibration values for setting the plurality of CTAT calibration select switches; and setting the plurality of the CTAT calibration select switches consistent with the CTAT calibration values.

15. The calibration technique in accordance with claim 14 wherein the CTAT calibration values for setting the plurality of CTAT calibration select switches are stored in non-volatile memory.

16. The calibration technique in accordance with claim 2 further comprising the steps of:

computing the CTAT current for the target clock frequency;

determining CTAT calibration values for setting a plurality of CTAT calibration select switches;

storing the CTAT calibration values for setting the plurality of CTAT calibration select switches;

reading the CTAT calibration values for setting the plurality of CTAT calibration select switches; and setting the plurality of the CTAT calibration select switches consistent with the CTAT calibration values.

17. The calibration technique in accordance with claim 16 wherein the CTAT calibration values for setting the plurality of CTAT calibration select switches are stored in non-volatile memory.

* * * * *